US006420251B1

United States Patent
Elmadjian et al.

(10) Patent No.: US 6,420,251 B1
(45) Date of Patent: Jul. 16, 2002

(54) METHOD FOR FABRICATING A MICROELECTRONIC INTEGRATED CIRCUIT WITH IMPROVED STEP COVERAGE

(75) Inventors: Raffi N. Elmadjian, Arcadia; George L. Kerber, San Diego, both of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/225,672

(22) Filed: Jan. 5, 1999

(51) Int. Cl.[7] .............................................. H01L 21/44
(52) U.S. Cl. ...................... 438/597; 438/597; 438/618; 438/626; 438/631; 438/637
(58) Field of Search ............................ 438/597, 622–26, 438/618, 631, 637; 420/425; 428/457; 257/30–32

(56) References Cited

U.S. PATENT DOCUMENTS

| | | | | |
|---|---|---|---|---|
| 4,938,839 A | * | 7/1990 | Fujimura et al. | 156/628 |
| 5,476,719 A | * | 12/1995 | Sandell et al. | 428/457 |
| 5,717,251 A | * | 2/1998 | Hayashi et al. | 257/758 |
| 5,739,579 A | * | 4/1998 | Chiang et al. | 257/635 |
| 5,854,126 A | * | 12/1998 | Tobben et al. | 438/626 |
| 5,962,865 A | * | 10/1999 | Kerber et al. | 257/30 |
| 6,011,274 A | * | 1/2000 | Gu et al. | 257/59 |
| 6,087,251 A | * | 2/2000 | Hsu | 438/618 |
| 6,184,121 B1 | * | 2/2000 | Buchwalter et al. | 438/622 |
| 6,071,809 A | * | 6/2000 | Zhao | 438/634 |
| 6,143,646 A | * | 11/2000 | Wetzel | 438/637 |
| 2001/0013908 A1 | * | 8/2001 | Gu et al. | 349/43 |

OTHER PUBLICATIONS

Marathe et al. "Planarization techniques for multilevel HTS integrated circuit process" IEEE Trans. on Applied Superconductivity vol. 3 Mar. 1993 p. 2373–76.*

G. L. Kerber, et al., "An Improved NbN Integrated Circuit Process Featuring Thick NbN Ground Plane and Lower Parasitic Circuit Inductances," IEEE Transactions on Applied Superconductivity, vol. 7, No. 2, Jun. 1997, pp. 2638–2643.

* cited by examiner

*Primary Examiner*—Matthew Smith
*Assistant Examiner*—Granvill D Lee, Jr.
(74) *Attorney, Agent, or Firm*—Connie Thousand

(57) ABSTRACT

A method for fabricating an integrated circuit which reduces steps in the integrated circuit comprising the steps of depositing a first conductive material layer over the first dielectric material layer and patterning the first conductive material layer to form a first conductive pattern. A second dielectric layer is then deposited over the first conductive pattern and the exposed portions of the first dielectric material layer. A planarizing material layer is applied over the second dielectric material layer and cured such that the planarizing material layer produces a substantially planar top surface. The planarizing material layer and portions of the second dielectric material layer are removed in a manner which maintains the substantially planar top surface until only a preselected amount of material remains over the first conductive pattern.

27 Claims, 5 Drawing Sheets

METHOD FOR FABRICATING A MICROELECTRONIC INTEGRATED CIRCUIT WITH IMPROVED STEP COVERAGE

BACKGROUND OF THE INVENTION

This invention relates generally to a method for fabricating an integrated circuit and more particularly, to a method for fabricating an integrated circuit which provides improved step coverage.

Microelectronic integrated circuits, in particular superconductor integrated circuits, are formed of multiple dielectric layers having multilayer metal interconnects or wires within and between each layer. These wires create high spots, or steps, in the dielectric layers deposited over the wires, requiring subsequent wire layers to cross over the steps. The wires have a tendency to thin and break at the crossover point because of the strains placed on the wire from the step. These strains are increased with each successively applied dielectric and wire layer. This problem, known as poor step coverage, reduces integrated circuit yield and limits the amount of circuitry which can be included in an integrated circuit by restricting the number of available wiring layers to about four in superconductor integrated circuits. In other integrated circuit technologies, such as CMOS, the surface topology is more severe which limits the number of metal wiring layers to two or possibly three layers.

One method known in the art to reduce the steps and thereby improve step coverage in some integrated circuits is to chemically machine away the steps such that the wires do not cross over steps. However, chemical machining is expensive and time consuming.

Another method known in the art to reduce the steps in some integrated circuits is to apply a high molecular weight polystyrene material and different types of photoresist material over the steps and etch the materials away in a manner such that the steps are etched away. However, this method removes the material unevenly such that the surface of the integrated circuit is only 45–50% planar, which is inadequate for many microelectronic integrated circuit applications.

What is needed therefore, is a method to reduce the steps in an integrated circuit thereby improving step coverage in integrated circuits. The method should provide an integrated circuit having a substantially planar surface free of chemical machining.

SUMMARY OF THE INVENTION

The aforementioned need in the prior art is satisfied by this invention, which provides a method for fabricating an integrated circuit having a substrate with a first dielectric material layer. The method comprising the steps of applying a first conductive layer to the first dielectric material layer such that the first conductive layer covers a portion of the first dielectric material layer and extends outwardly therefrom. A portion of the first conductive layer is removed to create a first conductive pattern. A second dielectric layer is deposited over the first conductive pattern and exposed portion of the first dielectric material layer forming steps in said first dielectric material layer. A planarizing material layer is applied over the second dielectric material layer such that the planarizing material layer provides an approximately planar top surface distal from the second dielectric material layer. Portions of the planarizing material layer and the second dielectric material layer are removed such that the approximately planar top surface is approximately continually maintained until the first wire pattern is exposed.

BRIEF DESCRIPTION OF THE DRAWINGS

Reference is now made to the drawings in which.

DETAILED DESCRIPTION OF THE PREFERRED EMBODIMENTS

The present invention relates to a method for forming a microelectronic integrated circuit. More specifically, the present invention relates to a method for producing a microelectronic integrated circuit having improved step coverage. For illustration, the preferred embodiment of the invention is described and illustrated in FIGS. 1a through 1f; and, a second embodiment of the invention is described and illustrated in FIGS. 2a through 2b. FIGS. 3a–3d, 4a–4b and 5a–5b illustrate additional preparation steps used for forming a microelectronic circuit in accordance with a third, fourth and fifth embodiment of the present invention respectively.

Figure 1A:
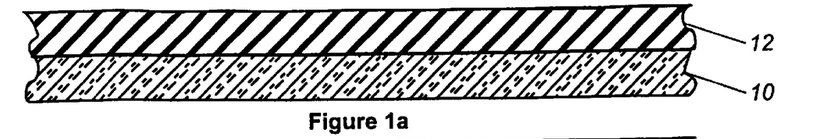
FIGS. 1a–1f are illustrations of the preparation steps used for forming a microelectronic circuit in accordance with the present invention.

Initially, as illustrated in FIG. 1a, a substrate 10 having a first dielectric material layer 12 is provided. Typically, the first dielectric material layer 12 is a silicon dioxide material layer but can be any dielectric material known in the art to be suitable for use in the fabrication of integrated circuits.

Figure 1B:
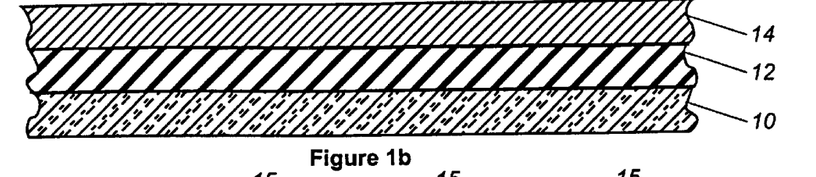

Referring to FIG. 1b, the first step in the process is to apply a first conductive material layer 14 over the first dielectric material layer 12. The first conductive material layer 14 is preferably applied using an evaporating or sputtering process but can be applied using any process known in the art. A more detailed description of processes such as evaporating or sputtering used to apply materials can be found in Microelectronic Processing and Device Design, by Roy A. Colclaser, 1980. For a typical integrated circuit application, the first conductive material layer 14 can be any conductive material including copper, aluminum and the like. However, for a superconductive integrated circuit application, it is preferred that the first conductive material layer 14 be Niobium (Nb), Niobium Nitride (NbN) or a yttrium, barium, copper oxide compound (YBCO) material since these materials have excellent conductive properties at high and low temperatures respectively.

Figure 1C:
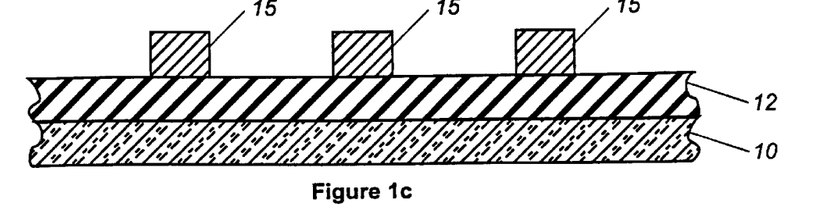

Referring to FIGS. 1b–1c, the next step in the process is to pattern the first conductive material layer 14 by removing a preselected portion of the first conductive material layer 14 which expose portions of the first dielectric material 12 layer 14, thereby creating a first conductive pattern 15 from the first conductive material layer 14. It is preferred that the preselected portion of the first conductive layer 14 be removed by an etching process but can be removed by any process known in the art. A more detailed description of processes such as etching used to remove materials can also be found in the reference above. The portion of the first conductive material remaining after the removal step comprises the first conductive pattern 15. The first conductive pattern 15 can be comprised of electrical components, Josephson junctions, transmission lines, capacitors or the like.

Figure 1D:
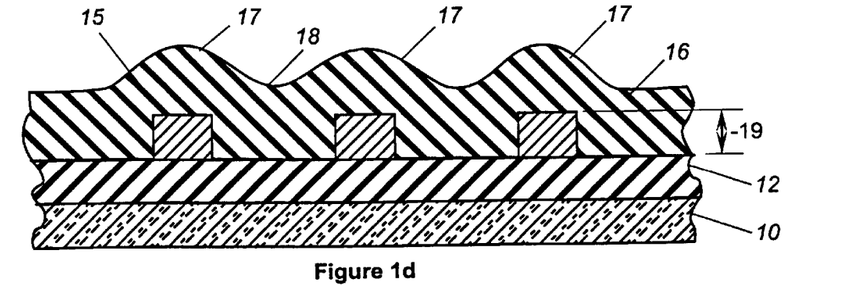

As illustrated in FIG. 1d, the next step of the process relates to depositing a second dielectric material layer 16 over the first conductive pattern 15 and exposed portions of the first dielectric material layer 12. The second dielectric material layer 16 is a silicon dioxide material layer or any other dielectric material layer known to one skilled in the art is preferably deposited with a spinning-on or sputtering process but can be applied by any method known in the art. The second dielectric material layer 16 is applied substantially evenly over the entire first conductive pattern 15 and the exposed portion of the first dielectric layer 12 thereby creating steps or bumps 17 in the second dielectric material layer 16. The second dielectric material layer 16 is preferably applied to a sufficient enough thickness such that the portion 18 of the second dielectric layer 16 covering the exposed portions of the first dielectric layer 12 is at least as thick as the thickness 19 of the first conductive pattern 15.

Figure 1E:
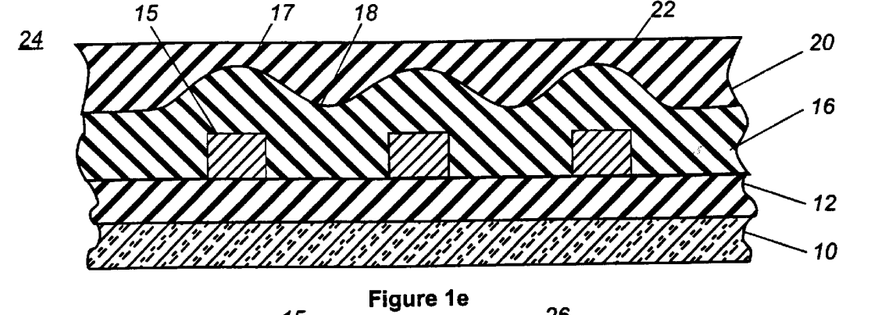

As shown in FIG. 1e, the next step of the process relates to applying a planarizing material layer 20 over the second dielectric material layer 16 to form a substantially planar or flat top surface 22. The planarizing material 20 is a planarizing polymer material 20 which is a liquid form when applied to the second dielectric material layer 16 and solidifies upon curing. For the preferred embodiment of the invention, the planarizing material 20 is a benzocyclobutene (BCB), cyclotene 3022 polymeric material, marketed by Dow Chemical, which is applied to the second dielectric material layer 16 using a spinning-on technique. This material is preferred for its planarizing properties since the top surface 26 of the benzocyclobutene, cyclotene 3022 polymeric resin material becomes substantially planar upon curing. In particular, when the benzocyclobutene, cyclotene 3022 polymeric material is applied over a non-planar surface with surface features ranging in size from 100 micrometers to below 0.5 micrometers, and cured in a vacuum oven at temperatures between approximately 210 C. and 240 C., the material crosslinks and provides a top surface 26 which is 90–95% planar. In the curing process, to assure that the vacuum environment is free of oxygen, the oven is first purged with nitrogen before the vacuum is created.

Referring to FIG. 1e, the next step in the process relates to preparing the circuit 24 for deposition with additional dielectric and conductive patterns or components. To do so, the planarizing material layer 20 and a portion of the second dielectric material layer 16 are removed in a manner which maintains the substantially planar top surface 22 at all times during the removal of the materials 16, 20. To maintain the substantially planar top surface 22, both the planarizing material layer 20 and the second dielectric material layer 16 must be removed at substantially equivalent rates. To do so, the planarizing material layer 20 and the second dielectric material layer 16 are preselected to have approximately equivalent etch rates, preferably within 95% of one another, so that the planarizing material 20 and the second dielectric material layer 16 can be removed by an etching process at substantially equal rates. By selecting materials 16, 20 having substantially equivalent etch rates, the substantially planar top surface 22 is maintained throughout the etching process.

Two such materials which have substantially equivalent etch rates are silicon dioxide and a benzocyclobutene (BCB), cyclotene 3022 polymeric material where the silicon dioxide is used to provide the second dielectric material layer 16 and the polymeric material is used as the planarizing material 20. To maintain the substantially planar top surface 22, it is preferred that the materials 16, 20 be removed by an etching process that uses $CF_4$ and $CHF_3$ gases or any combination of $C_xH_yF_z$ compounds and oxygen in a reactive ion etcher, where x, y and z are numerical values from one to n. Tests have shown that an etching process which uses the above gases or compounds removes both materials 16, 20 at approximately equal rates such that the substantially planar (flat) top surface 22 is maintained at all times during the removal process. Tests have also shown that the height of a step 17 (FIG. 1d) will be reduced by at least 80% using the above etching technique in low cost reactive ion etcher. When using a more sophisticated reactive ion etcher which has better etch uniformity and higher pumping capacity, the height of a step 17 can be reduced by greater than 90%.

Figure 1F:
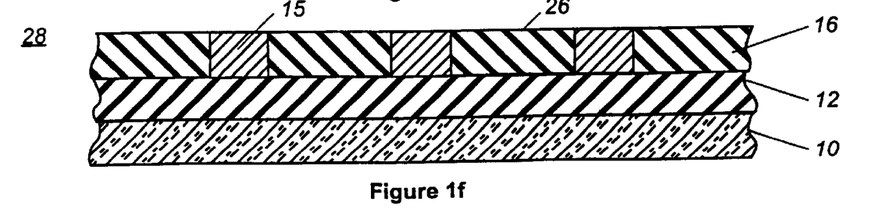
Figure 2A:
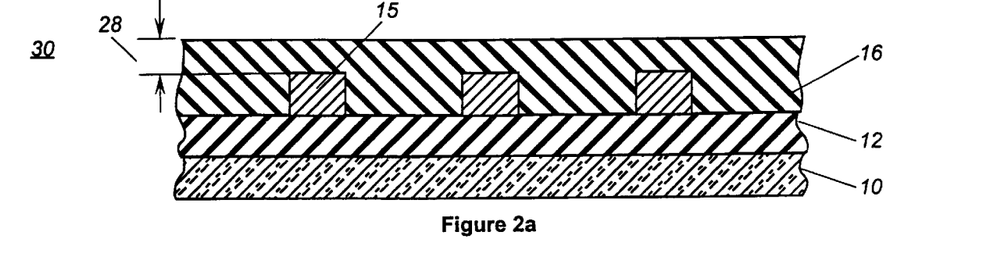
FIGS. 2a–2b are illustrations of additional preparation steps used for forming a microelectronic circuit in accordance with a second embodiment of the present invention.
Figure 2B:
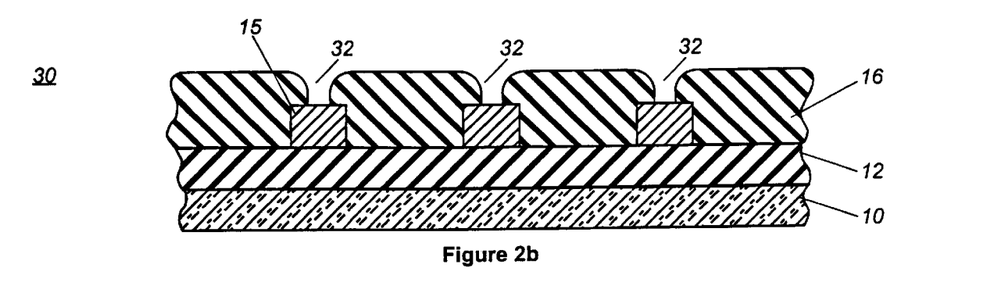
Figure 3A:
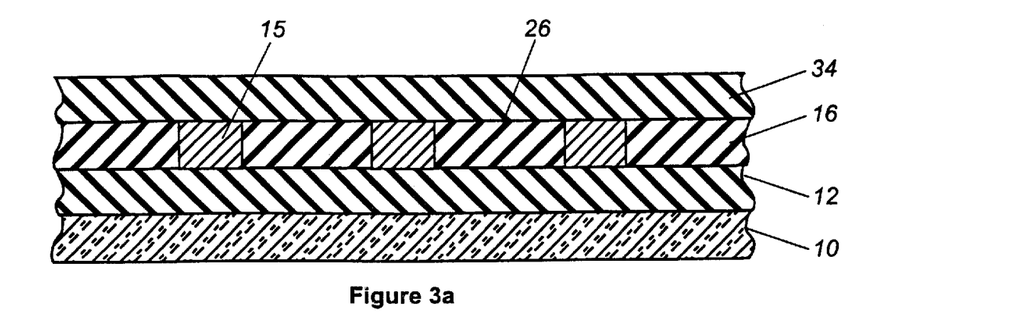
FIGS. 3a–3d are illustrations of additional preparation steps used for forming a microelectronic circuit in accordance with a third embodiment of the present invention; and, FIGS. 4a–4b and 5a–5b are illustrations of additional preparation steps used for forming a microelectronic circuit in accordance with a fourth and fifth embodiment of the present invention, respectively.
Figure 3B:
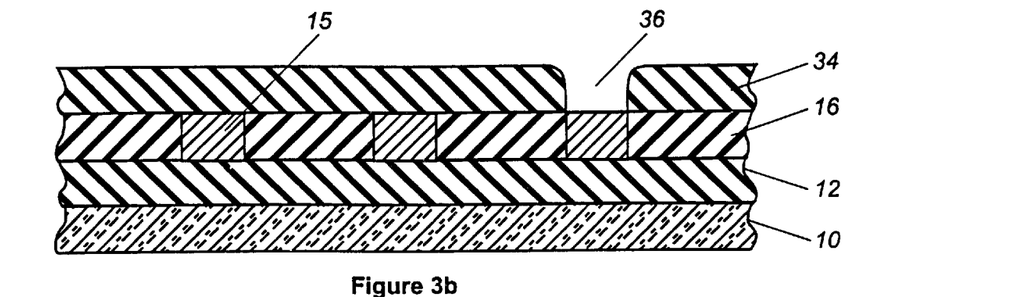
Figure 3C:
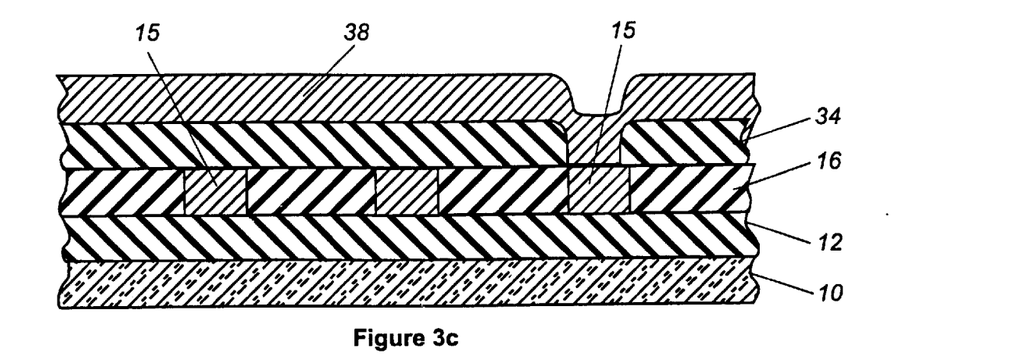
Figure 3D:
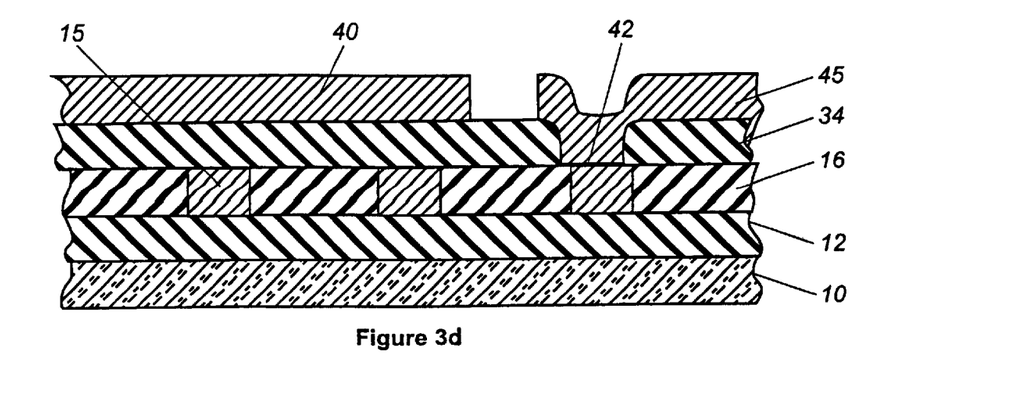

Referring to FIG. 1f, for the preferred embodiment of the invention, the materials 16, 20 are removed until the top surface 26 of the first conductive pattern 15 is exposed. Referring to FIGS. 1e & 2a–2b, for the second embodiment of the invention, instead of removing the materials 16, 20 until the first conductive pattern 15 is exposed, only a preselected amount of the materials 16, 20 is removed leaving a portion 28 of the materials 16, 20 over the first conductive pattern 15. Depending on the thickness to which the materials 16, 20 were applied, the remaining portion of the materials 16, 20 can be comprised of a portion of both the second dielectric material layer 16 and the planarizing material layer 20 or only the second dielectric material layer 16. For compactness of the circuit 30, it is preferred that no more than one micron 28 of material 16, 20 be left over the first conductive pattern 15. Referring to FIG. 2b, vias 32 are created in the portion 28 of the material 16, 20 covering the first conductive material pattern 15. The vias 32 are preferably created using an etching technique. Referring to FIGS. 1f & 2b, the circuits 28, 30 are now ready for deposition with additional dielectric and conductive patterns or components.

The next step of the process relates to conducting additional preparation steps to add additional conductive patterns to the circuits 28, 30 generating multi-level integrated microelectric circuits and superconductive integrated circuit.

Referring to FIGS. 1f & 3a–3d, for a third embodiment of the invention, a third dielectric material layer 34 is deposited over the top surface 26 of the first conductive pattern 15 and the remaining second dielectric material layer 16. Vias 36 are selectively created in the third dielectric material layer 34 exposing the first conductive pattern 15. A second conductive material layer 38 is deposited into the vias 36 and over the remaining portion of the third dielectric material layer 34 preferably by a sputtering or spinning-on technique. The second conductive material layer 38 can be any conductive material such as copper, aluminum or the like. For a superconductive integrated circuit application, it is preferred that the second conductive layer 38 be of a Niobium (Nb), Niobium Nitride (NbN) or yttrium, barium, copper oxide compound (YBCO) material.

A second conductive pattern 40 is created from the second conductive material layer 38 by removing a preselected portion of the second conductive material layer 38 preferably by patterning and etching the second conductive material layer 38 thereby forming a second conductive pattern 40 and predetermined contact junctions 42 between the first 15 and second 40 conductive patterns. Additional conductive patterns can be subsequently applied by repeating the steps shown in FIGS. 1*d*–1*f* & 3*a*–3*d*.

Figure 4A:
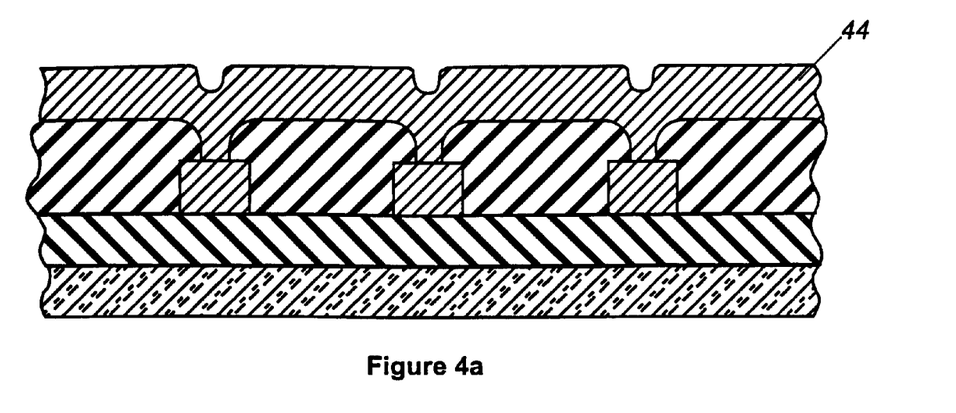
Figure 4B:
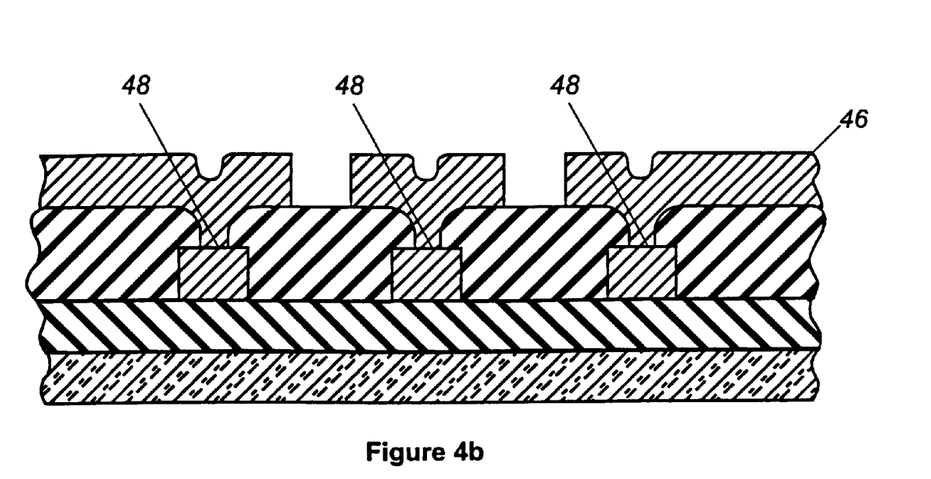

Referring to FIGS. 2*b* & 4*a*–4*b*, for a fourth embodiment of the invention, a second conductive material layer 44 is deposited into the vias 32 and over the remaining material 16, 20 preferably by a sputtering or spinning-on technique. The second conductive material layer 44 can be any conductive material such as copper, aluminum or the like. For a superconductive integrated circuit application, it is preferred that the second conductive material 44 be of a Niobium (Nb), Niobium Nitride (NbN) or yttrium, barium, copper oxide compound (YBCO) material.

A second conductive pattern 46 is created in the second conductive material layer 44 by removing a preselected portion of the second conductive material layer 44 preferably by patterning and etching the second conductive material layer 44 thereby forming a second conductive pattern 46 and predetermined contact junctions 48 between the first 15 and second 46 conductive patterns. Additional conductive patterns can be subsequently applied by repeating the steps shown in FIGS. 1*d*, 2*a*–2*b* & 4*a*–4*b*.

Figure 5A:
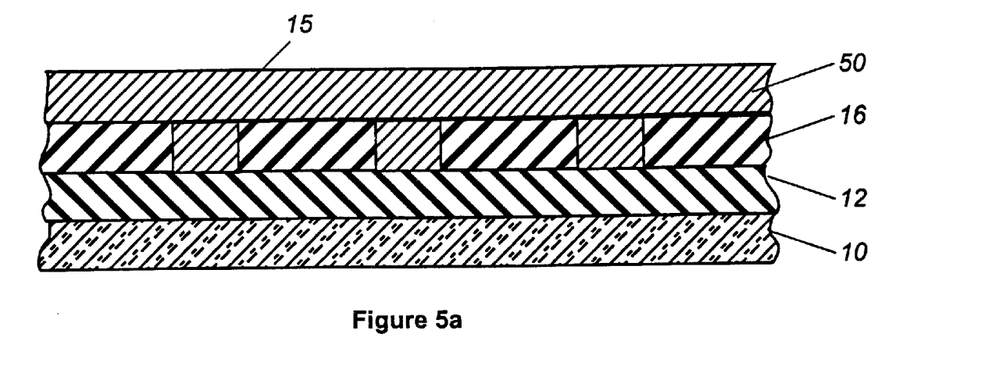
Figure 5B:
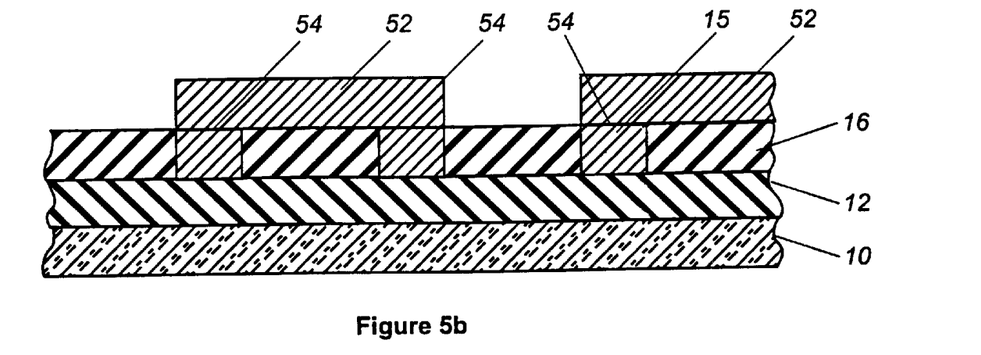

Referring to FIGS. 1*f* & 5*a*–5*b*, for the fifth embodiment of the invention, the second conductive material layer 50 is applied directly onto the first conductive pattern 15 and the remaining portion of the second dielectric material layer 16 without first applying a dielectric layer. In this manner, portions of the second conductive material layer 50 are in direct contact with the first conductive pattern 15. Selective portions of the second conductive layer 50 are removed, preferably by an etching process, thereby producing a second conductive pattern 52 from the second conductive material layer 50. This creates self-aligned contact junctions 54 between the first 15 and second 52 conductive patterns. This embodiment is particular applicable when the first conductive pattern 15 contains counter electrodes of Josephson junctions whose contacts require self alignment. Additional information on Josephson junction fabrication can be found in the article "An Improved NbN Integrated Circuit Process Featuring Thick NbN Ground Plane and Lower Parasitic Circuit Inductance" by G. L. Kerber et. al and published in the IEEE Transactions on Applied Superconductivity, Vol. 7, No. 2, June 1997, pg. 2638–2643. Additional conductive patterns can be subsequently added by repeating the steps shown in FIGS. 1*d*–1*f* & 5*a*–5*b*.

It will be appreciated by persons skilled in the art that the present invention is not limited to what has been shown and described hereinabove, nor the physical implementation described immediately above. The scope of the invention is limited solely by the claims which follow.

We claim as our invention:

1. A method for fabricating an integrated circuit comprising the steps of:

providing a first dielectric material layer;

depositing a first conductive material layer onto said first dielectric material layer;

patterning said first conductive material layer by removing preselected portions of said first conductive material layer thereby exposing portions of said first dielectric material layer and creating a first conductive pattern from said first conductive material layer;

depositing a non-planarizing second dielectric material layer comprising silicon dioxide over said first conductive pattern and exposed portion of said first dielectric material layer;

depositing a benzocyclobutene planarizing material layer over said non-planarizing second dielectric material layer forming a substantially planar top surface; and, etching away substantially all of said planarizing material layer and portions of said non-planarizing second dielectric material layer using a mixture of $CHF_3$ and $CF_4$ compounds and oxygen in a reactive ion etcher so that said substantially planar top surface is maintained during etching until only a preselected amount of said second dielectric material covers said first conductive pattern and said top surface of said second dielectric material is substantially planar.

2. The method of claim 1, wherein the step of etching away substantially all of said planarizing material layer and portions of said second dielectric material layer further comprises the step of etching away substantially all of said planarizing material layer and portions of said second dielectric material until less than approximately one micron of said second dielectric material covers said first conductive pattern.

3. The method of claim 1, wherein the step of etching away substantially all of said planarizing material layer and portions of said second dielectric material layer further comprises the step of etching away substantially all of said planarizing material layer and portions of said second dielectric material layer until said first conductive pattern is exposed.

4. The method as in claim 3, further comprising the steps of:

depositing a second conductive material layer over said first conductive pattern and over the remaining portion of the second dielectric material layer; and, patterning said second conductive material layer to form a second conductive pattern and predetermined contact junctions between said first and second conductive patterns.

5. The method as in claim 3, further comprising the steps of:

depositing a third dielectric material layer over said exposed first conductive pattern and remaining second dielectric material layer;

selectively creating vias in said third dielectric material layer exposing preselected portions of said first conductive pattern;

depositing a second conductive material layer into said vias and over said third dielectric material layer; and, removing preselected portions of said first conductive material layer to form a second conductive pattern and predetermined contact junctions between said first and second conductive patterns.

6. The method as in claim 1, wherein said step of applying a first conductive material layer to said first dielectric material layer further comprises the steps of:

applying a conductive material layer over said first dielectric material layer, said conductive material layer comprised of a material selected from the group of Niobium (Nb), Niobium Nitride (NbN) or yttrium, barium, copper oxide compound (YBCO).

7. The method as in claim 1, further comprising the step of:

selecting the material of the planarizing material layer and the second dielectric material layer to have approximately equivalent etch rates; and, the step of etching away substantially all of said planarizing material layer and a portion of said second dielectric material layer further comprises the step of:

etching away substantially all of said planarizing material layer and a portion of said second dielectric material layer at approximately equal rates thereby maintaining said substantially planar top surface at all times during removal.

8. The method as in claim 7, wherein the step of selecting a planarizing material layer and a first dielectric material layer having approximately equivalent etch rates further comprises the steps of:
  selecting a planarizing material layer having a first etch rate; and, selecting a first dielectric material layer having a second etch rate, said first and second etch rates being within 95% of each other.

9. The method as in claim 8, wherein the step of selecting a planarizing material layer and a first dielectric material layer having approximately equivalent etch rates further comprises the steps of:
  selecting a benzoncyclobutene, cyclotene 3022 polymeric material for said planarizing material layer and selecting a silicon dioxide material for said first dielectric material layer, said polymeric material having a first etch rate and said silicon dioxide material having a second etch rate, said first and second etch rates being within 95% of each other.

10. The method as in claim 9, further comprising the step of:
  curing said polymeric material layer at a temperature between approximately 210° C. and 240° C. in a reactive ion etcher to crosslink said polymeric material layer.

11. The method as in claim 10, wherein the step of curing said polymeric material layer further comprises the step of curing said polymeric material layer in a reactive ion etcher, in an environment comprised of $CF_4$ and $CHF_3$ gases, at a temperature between approximately 210° C. and 240° C. to crosslink said polymeric material layer and provide said substantially flat top surface.

12. The method as in claim 10, wherein the step of curing said polymeric material layer further comprises the step of curing said polymeric material layer in a reactive ion etcher, in an environment comprising $C_xH_yF_z$ compounds and oxygen where x, y and z have values between one and n, at a temperature between approximately 210° C. and 240° C. to crosslink said polymeric material layer and provide said substantially planar top surface.

13. The method of claim 1, wherein said step of etching further comprises
  etching away substantially all of said planarizing material layer and portions of said non-planarizing second dielectric material layer using a mixture of $CHF_3$ and $CF_4$ compounds and oxygen in a reactive ion etcher so that said substantially planar top surface is maintained during etching until only a preselected amount of said second dielectric material covers said first conductive pattern and said top surface of said second dielectric material is 90 to 95 percent planar.

14. A method for fabricating a superconductive microelectronic integrated circuit comprising the steps of:
  providing a first dielectric material layer;
  selecting a first conductive material from the group consisting of Nb, NbN and YBCO;
  applying said first conductive material to said first dielectric material layer to form a first conductive material layer;
  patterning said first conductive material layer by removing preselected portions of said first conductive material layer to form a first conductive pattern;
  selecting a non-planarizing second dielectric material comprising silicon dioxide and a planarizing benzocyclobutene polymeric material having approximately equivalent etch rates;
  depositing said non-planarizing second dielectric material over said first conductive pattern and exposed portion of said first dielectric material layer forming a non-planar second dielectric material layer;
  applying said planarizing polymeric material over said second dielectric material layer;
  curing said planarizing polymeric material to provide a substantially planar top surface; and,
  removing said planarizing polymeric material layer and a preselected portion of said second dielectric material layer by etching away substantially all of said planarizing polymeric material layer and portions of said second dielectric material layer at substantially equivalent etch rates using a mixture of $CHF_3$ and $CF_4$ compounds and oxygen in a reactive ion etcher so that said substantially planar top surface is maintained at all times during removal and producing therefrom a substantially planar second dielectric material.

15. The method as in claim 14, wherein the step of selecting a planarizing material layer and a first dielectric material layer having approximately equivalent etch rates further comprises the steps of:
  selecting a planarizing material layer having a first etch rate; and, selecting a first dielectric material layer having a second etch rate, said first and second etch rates being within 95% of each other.

16. The method as in claim 15, wherein the step of selecting a planarizing material layer and a first dielectric material layer having approximately equivalent etch rates further comprises the steps of:
  selecting a benzoncyclobutene, cyclotene 3022 polymeric material for said planarizing material layer and selecting a silicon dioxide material for said first dielectric material layer, said polymeric material having a first etch rate and said silicon dioxide material having a second etch rate, said first and second etch rates being within 95% of each other.

17. The method as in claim 16, wherein said step of curing said polymeric material layer further comprises the step of:
  curing said planarizing material layer in a reactive ion etcher at a temperature between approximately 210° C. and 240° C. to crosslink said resin material layer and provide a substantially planar top surface.

18. The method as in claim 17, wherein the step of curing said polymeric material layer further comprises the step of curing said polymeric material layer in a reactive ion etcher, in an environment comprised of $CF_4$ and $CHF_3$ gases, at a temperature between approximately 210° C. and 240° C. to crosslink said polymeric material layer and provide said substantially flat top surface.

19. The method as in claim 17, wherein the step of curing said polymeric material layer further comprises the step of curing said polymeric material layer in a reactive ion etcher, in an environment comprising $C_xH_yF_z$ compounds and oxygen where x, y and z have values between one and n, at a temperature between approximately 210° C. and 240° C. to crosslink said polymeric material layer and provide said substantially planar top surface.

20. The method of claim 16, further comprising the step of:
  applying a second conductive pattern to said circuit comprising the steps of:
    creating vias in the portion of the second dielectric material layer covering preselected portions of said first conductive pattern to expose preselected portions of said first conductive pattern if those portions were not exposed during the removal step;

selecting a second conductive material from the group consisting of Nb, NbN and YBCO;

depositing said second conductive material over the remaining portion of the second dielectric material layer and any exposed portions of said first conductive pattern; and, removing preselected portions of the second conductive material to form a second conductive pattern with portions of said first and second conductive patterns being in contact forming predetermined contact junctions.

21. The method as in claim 16, further comprising the steps of:

applying a second conductive pattern to said circuit comprising the steps of:

depositing a third dielectric material layer over said remaining second dielectric material layer and exposed portions of said first conductive pattern;

selectively creating vias in said third dielectric material layer and any remaining portion of said second dielectric layer still covering preselected portions of said first conductive pattern exposing preselected portions of said first conductive pattern;

selecting a second conductive material from the group consisting of Nb, NbN and YBCO;

depositing a second conductive material layer into said vias and over said third dielectric material layer; and, removing preselected portions of said first conductive material layer to form a second conductive pattern and predetermined contact junctions between said first and second conductive patterns.

22. The method of claim 14, wherein the step of removing comprises removing said planarizing polymeric material layer and a preselected portion of said second dielectric material layer by etching away substantially all of said planarizing polymeric material layer and portions of said second dielectric material layer at substantially equivalent etch rates said substantially planar top surface is maintained at all times during removal to produce a 90 to 95% planar top surface on said second dielectric material.

23. A method for fabricating a microelectronic integrated circuit comprising the steps of:

providing a first dielectric material layer;

applying a first conductive material layer to said first dielectric material layer;

patterning said first conductive material layer by removing preselected portions of said first conductive material layer to form a first conductive pattern;

selecting a planarizing benzocyclobutene, cyclotene 3022 polymeric material having a first etch rate and a non-planarizing silicon dioxide dielectric material having a second etch rate which is within about approximately 95% of the first etch rate;

depositing said silicon dioxide dielectric material over said first conductive pattern and exposed portion of said first dielectric material layer forming a non-planarized silicon dioxide dielectric material layer;

depositing said polymeric material over said silicon dioxide dielectric material layer forming a planarized polymeric material layer;

curing said polymeric material in a reactive ion etcher at a temperature between approximately 210° C. and 240° C. to crosslink said polymeric material layer such that a substantially planar surface is provided by said polymeric material layer; and, removing substantially all of said polymeric material layer and a preselected portion of said silicon dioxide dielectric material layer by etching away said polymeric material layer and silicon dioxide dielectric material layer at substantially equivalent etch rates using a mixture of $CHF_3$ and $CF_4$ compounds and oxygen in a reactive ion etcher so that said substantially planar top surface is maintained at all times during removal to produce therefrom a substantially planar second dielectric material.

24. The method as in claim 23, wherein the step of curing said polymeric material layer further comprises the step of curing said polymeric material layer in a reactive ion etcher, in an environment comprised of $CF_4$ and $CHF_3$ gases, at a temperature between approximately 210° C. and 240° C. to crosslink said polymeric material layer and provide said substantially flat top surface.

25. The method as in claim 23, wherein the step of curing said polymeric material layer further comprises the step of curing said polymeric material layer in a reactive ion etcher, in an environment comprising $C_xH_yF_z$ compounds and oxygen where x, y and z have values between one and n, at a temperature between approximately 210° C. and 240° C. to crosslink said polymeric material layer and provide said substantially planar top surface.

26. The method of claim 23, wherein the step of applying a first conductive material layer to said first dielectric material layer further comprises the step of:

applying a first conductive material layer to said first dielectric material layer, said first conductive material layer being of a material selected from the group consisting of Nb, NbN and YBCO.

27. The method of claim 23, wherein the step of removing comprises removing substantially all of said polymeric material layer and a preselected portion of said silicon dioxide dielectric material layer by etching away said polymeric material layer and silicon dioxide dielectric material layer at substantially equivalent etch rates using a mixture of $CHF_3$ and $CF_4$ compounds and oxygen in a reactive ion etcher so that said substantially planar top surface is maintained at all times during removal to produce therefrom a 90 to 95% planar top surface on said second dielectric material.

* * * * *